(12) United States Patent
Yokokura

(10) Patent No.: US 9,915,971 B2
(45) Date of Patent: Mar. 13, 2018

(54) TRANSMISSION APPARATUS

(71) Applicant: FUJITSU LIMITED, Kawasaki-shi, Kanagawa (JP)

(72) Inventor: Ichiro Yokokura, Sano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/272,799

(22) Filed: Sep. 22, 2016

(65) Prior Publication Data

US 2017/0115687 A1   Apr. 27, 2017

(30) Foreign Application Priority Data

Oct. 23, 2015   (JP) .................................. 2015-209343

(51) Int. Cl.
| | |
|---|---|
| *H04B 10/27* | (2013.01) |
| *G06F 1/12* | (2006.01) |
| *H03K 19/177* | (2006.01) |
| *H04L 7/00* | (2006.01) |
| *G11C 19/28* | (2006.01) |

(52) U.S. Cl.
CPC ................ *G06F 1/12* (2013.01); *G11C 19/28* (2013.01); *H03K 19/17728* (2013.01); *H04B 10/27* (2013.01); *H04L 7/0075* (2013.01)

(58) Field of Classification Search
CPC ....................................................... H04B 10/27
See application file for complete search history.

(56) References Cited

U.S. PATENT DOCUMENTS

| | | | |
|---|---|---|---|
| 8,005,359 B2 * | 8/2011 | Wolf .................. | H04Q 11/0005 398/52 |
| 2014/0226981 A1 * | 8/2014 | Kuwabara ............. | H04J 3/1652 398/65 |
| 2015/0125148 A1 | 5/2015 | Odashima et al. | |
| 2015/0207510 A1 * | 7/2015 | Pace ...................... | H03K 21/10 377/47 |

FOREIGN PATENT DOCUMENTS

| | | |
|---|---|---|
| JP | 1-278139 | 11/1989 |
| WO | WO 2014/013602 A1 | 1/2014 |

* cited by examiner

*Primary Examiner* — Shi K Li
(74) *Attorney, Agent, or Firm* — Staas & Halsey LLP

(57) ABSTRACT

There is provided a transmission apparatus including: a shift register configured to generate a plurality of timing pulses indicating different timings, from a frame pulse synchronized with a frame signal; and a plurality of signal processors configured to sequentially process the frame signal based on timings indicated by one or more timing pulses among the plurality of timing pulses.

5 Claims, 16 Drawing Sheets

FIG.9

| Column No. | 1~80 | 81~3760 | 3761~3840 | 3841~4080 | 1~80 | 81~3760 | 3761~3840 | 3841~4080 |
|---|---|---|---|---|---|---|---|---|
| Row No. | 1 | | | | 2 | | | |
| TP | 0 | 1~46 | 47 | 48~50 | 51 | 52~97 | 98 | 99~101 |

| DATA GROUP | Byte | Bit | | | | | | | | |
|---|---|---|---|---|---|---|---|---|---|---|
| A | 1 | 632~639 | C1 | PD | PD | FC | C3 | PD | PD | FC |
|  | ... | ... | ... | ... | ... | | ... | ... | ... | |
|  | 7 | 584~591 | C1 | ... | ... | | ... | ... | ... | |
|  | 8 | 576~583 | C2 | | | | | | | |
|  | ... | ... | ... | | | | | | | |
|  | 13 | 536~543 | C2 | PD | PD | | C3 | PD | PD | |
| B | 14 | 528~535 | C2 | PD | PD | | C3 | PD | PD | |
| C | 15 | 520~527 | C4 | PD | PD | | C4 | PD | PD | |
|  | 16 | 512~519 | C4 | | | | C4 | | | |
|  | 17 | 504~511 | PD | | ... | ... | PD | | ... | |
|  | ... | ... | | ... | | | | ... | | |
|  | 56 | 192~199 | ... | | PD | | ... | | PD | |
|  | 57 | 184~191 | | | ST | | | | ST | |
|  | ... | ... | | | ... | | | | ... | |
|  | 64 | 128~135 | PD | PD | ST | | PD | PD | ST | |
| D | 65 | 120~127 | PD | PD | FC | | PD | PD | FC | |
|  | ... | ... | ... | ... | ... | | ... | ... | ... | |
|  | 80 | 0~7 | PD | PD | FC | FC | PD | PD | FC | FC |

FIG.10

| Column No. | 1~80 | 81~3760 | 3761~3840 | 3841~4080 | 1~80 | 81~3760 | 3761~3840 | 3841~4080 |
|---|---|---|---|---|---|---|---|---|
| Row No. | 3 | | | | 4 | | | |
| TP | 102 | 103~148 | 149 | 150~152 | 153 | 154~199 | 200 | 201~203 |

| DATA GROUP | Byte | Bit | | | | | | | | |
|---|---|---|---|---|---|---|---|---|---|---|
| A | 1 | 632~639 | C3 | PD | PD | FC | C3 | PD | PD | FC |
|   | ... | ... | ... | ... | ... | | ... | ... | ... | |
|   | 7 | 584~591 | | | | | | | | |
|   | 8 | 576~583 | ... | ... | ... | | ... | ... | ... | |
|   | ... | ... | | | | | | | | |
|   | 13 | 536~543 | | PD | PD | | | PD | PD | |
| B | 14 | 528~535 | C3 | PD | PD | | C3 | PD | PD | |
| C | 15 | 520~527 | C4 | PD | PD | | C4 | PD | PD | |
|   | 16 | 512~519 | C4 | | | | C4 | | | |
|   | 17 | 504~511 | PD | | ... | ... | PD | | ... | ... |
|   | ... | ... | ... | ... | | | ... | ... | | |
|   | 56 | 192~199 | ... | ... | PD | | ... | ... | PD | |
|   | 57 | 184~191 | | | ST | | | | ST | |
|   | ... | ... | | | ... | | | | ... | |
|   | 64 | 128~135 | PD | PD | ST | | PD | PD | ST | |
| D | 65 | 120~127 | PD | PD | FC | | PD | PD | FC | |
|   | ... | ... | ... | ... | ... | | ... | ... | ... | |
|   | 80 | 0~7 | PD | PD | FC | FC | PD | PD | FC | FC |

FIG.13

| Column No. | 1~12 | 13,14 | 15,16 | 17~3824 | 3825~4080 |
|---|---|---|---|---|---|
| Row No. | 1 ||||||
| COLUMN COUNTER VALUE | 0~5 | 6 | 7 | 8~1911 | 1912~2039 |
| ROW COUNTER VALUE | 0 |||||
| TPc | 0~5 | 6 | 7 | ~Lc | - |
| TPf | ~Lf | - | - | - | 0~127 |

| DATA GROUP | Byte | Bit | | | | | |
|---|---|---|---|---|---|---|---|
| A | 1 | 8~15 | OH | OH | OH | PD | FC |
| B | 2 | 0~7 | OH | OH | OH | PD | FC |

P11

| Column No. | 1~12 | 13,14 | 15,16 | 17~3824 | 3825~4080 |
|---|---|---|---|---|---|
| Row No. | 2 |||||
| COLUMN COUNTER VALUE | 0~5 | 6 | 7 | 8~1911 | 1912~2039 |
| ROW COUNTER VALUE | 1 |||||
| TPc | 0~5 | 6 | 7 | ~Lc | - |
| TPf | ~Lf | - | - | - | 0~127 |

| DATA GROUP | Byte | Bit | | | | | |
|---|---|---|---|---|---|---|---|
| A | 1 | 8~15 | OH | OH | OH | PD | FC |
| B | 2 | 0~7 | OH | OH | OH | PD | FC |

| Column No. | 1~12 | 13,14 | 15,16 | 17~3824 | 3825~4080 |
|---|---|---|---|---|---|
| Row No. | 3 ||||||
| COLUMN COUNTER VALUE | 0~5 | 6 | 7 | 8~1911 | 1912~2039 |
| ROW COUNTER VALUE | 2 |||||
| TPc | 0~5 | 6 | 7 | ~Lc | - |
| TPf | ~Lf | - | - | - | 0~127 |

| DATA GROUP | Byte | Bit | | | | | |
|---|---|---|---|---|---|---|---|
| A | 1 | 8~15 | OH | OH | OH | PD | FC |
| B | 2 | 0~7 | OH | OH | OH | PD | FC |

P13

| Column No. | 1~12 | 13,14 | 15,16 | 17~3824 | 3825~4080 |
|---|---|---|---|---|---|
| Row No. | 4 |||||
| COLUMN COUNTER VALUE | 0~5 | 6 | 7 | 8~1911 | 1912~2039 |
| ROW COUNTER VALUE | 3 |||||
| TPc | 0~5 | 6 | 7 | ~Lc | - |
| TPf | ~Lf | - | - | - | 0~127 |

| DATA GROUP | Byte | Bit | | | | | |
|---|---|---|---|---|---|---|---|
| A | 1 | 8~15 | OH | OH | OH | PD | FC |
| B | 2 | 0~7 | OH | OH | OH | PD | FC |

P14

TRANSMISSION APPARATUS

CROSS-REFERENCE TO RELATED APPLICATION

This application is based upon and claims the benefit of priority from the prior Japanese Patent Application No. 2015-209343, filed on Oct. 23, 2015, the entire contents of which are incorporated herein by references.

FIELD

The embodiments discussed herein are related to a transmission apparatus.

BACKGROUND

With the increase in communication demand, there has been used an optical transport network (OTN) technique which facilitates large-capacity data transmission (see, e.g., WO 2014/013602). The OTN technique is defined in, for example, the International Telecommunication Union Telecommunication Standardization Sector (ITU-T) Recommendation G.709.

An OTN transmission system facilitates large-capacity transmission since a plurality of client signals is transmitted in a state of being accommodated in a signal of a format of an optical channel transport unit (OTU) frame (hereinafter referred to as an "OTU" signal). Examples of the client signals may include a synchronous digital hierarchy (SDH) frame, a synchronous optical network (SONET) frame, an Ethernet® frame and the like. In addition, a plurality of types of OTU frames (e.g., OTU1, OTU4, etc.) is defined in the ITU-T Recommendation G.709 depending on a transmission rate.

A signal processing circuit for the OTU signal is divided into a plurality of stages by, for example, a field programmable gate array (FPGA). A plurality of signal processing circuits subjects the OTU signal to a frame synchronization process (see, e.g., Japanese Laid-Open Patent Publication No. 1-278139), and then, subjects the OTU signal to different types of processes in a sequential manner.

For example, for a FPGA of a 28 (nm) or 20 (nm) process, the OTU signal is processed after being parallel-converted by, for example, a serializer/deserializer (SERDES) circuit so that each signal processing circuit can sufficiently process the OTU signal even at a clock speed of about 200 (MHz). For example, for OTU4, the OTU signal is converted into 640 parallel data.

Related technologies are disclosed in, for example, WO 2014/013602 and Japanese Laid-Open Patent Publication No. 1-278139.

SUMMARY

According to an aspect of the invention, a transmission apparatus includes: a shift register configured to generate a plurality of timing pulses indicating different timings, from a frame pulse synchronized with a frame signal; and a plurality of signal processors configured to sequentially process the frame signal based on timings indicated by one or more timing pulses among the plurality of timing pulses.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a view illustrating a data area of a conversion object of an alarm indication signal (AIS) of an OTU4 frame;

FIG. 10 is a view illustrating a data area of a conversion object of an AIS of an OTU4 frame;

FIG. 13 is a view illustrating a data area of a conversion object of an AIS of an OTU1 frame;

FIG. 14 is a view illustrating a data area of a conversion object of an AIS of an OTU1 frame;

DESCRIPTION OF EMBODIMENTS

For example, each of a plurality of signal processing circuits for processing an OTU signal, which is constituted by an FPGA, includes a counter circuit for detecting individual timings at which the OTU signal is processed, and a decode circuit.

Therefore, in order to construct the plurality of signal processing circuits, more parallel data of the OTU signal require an FPGA including more flip-flops (FFs) and more look-up tables (LUTs). Further, dense arrangement of signal processing circuits in the FPGA requires additional FFs and LUTs for adjusting timings of the circuits, which may result in the increase in a scale of the signal processing circuit.

Accordingly, a large-capacity FPGA having the ability to construct a large-scaled circuit is required, which may result in the increase in apparatus costs. This problem is not limited to the FPGA but may also exist in other types of devices, such as an application specific integrated circuit (ASIC), and is not limited to the OTN but may also exist in other transmission systems.

Hereinafter, an embodiment of a technique for reducing a circuit scale of a transmission apparatus will be described with reference to the drawings.

Figure 1:
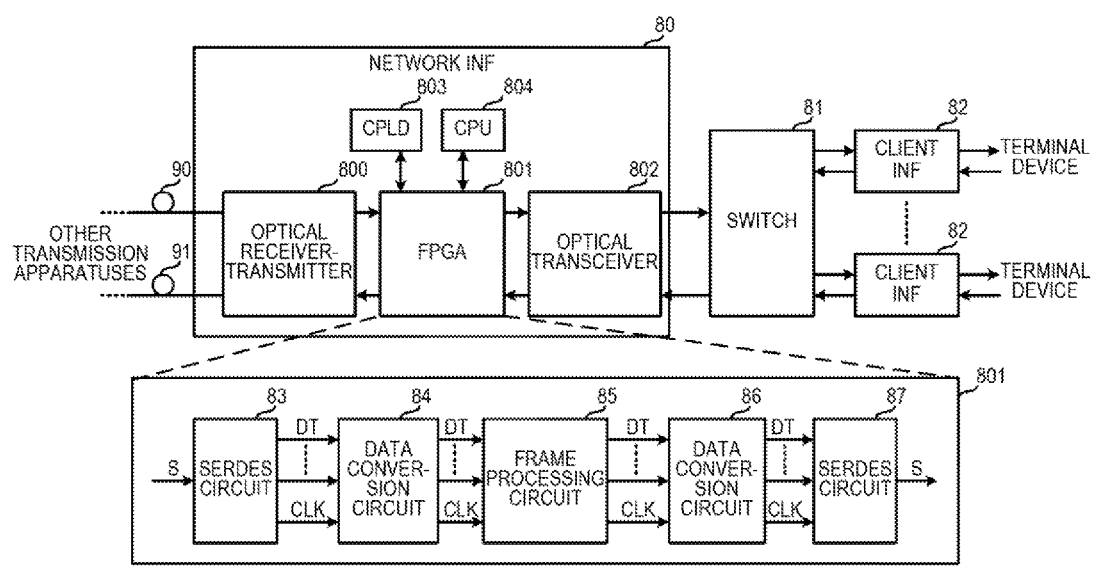
FIG. 1 is a view illustrating an exemplary configuration of a transmission apparatus.

FIG. 1 is a view illustrating an exemplary configuration of a transmission apparatus. The transmission apparatus includes a network interface (INF) 80, a switch 81, and a plurality of client interfaces (INF) 82. As an example, the transmission apparatus performs signal transmission based on the technology defined in the ITU-T Recommendation G.709 but may not be limited thereto.

The network INF 80, the switch 81, and the plurality of client INFs 82 are, for example, circuit boards including electronic parts and the like mounted thereon and are accommodated in slots formed in a housing of the transmission apparatus, respectively. The network INF 80 transmits/receives optical signals with other transmission apparatuses via transmission lines 90 and 91 such as optical fibers. The client INFs 82 transmit/receive client signals with terminal devices.

The switch 81 is connected with the network INF 80 and the plurality of client INFs 82 via transmission lines such as optical fibers within the apparatus. The switch 81 exchanges client signals between the network INF 80 and the plurality of client INFs 82. Therefore, the client signals are input from the network INF 80 to the switch 81 and output to the client INFs 82 corresponding to its destination.

The network INF 80 includes optical receivers-transmitters 800 and 802, an FPGA 801, a complex programmable logic device (CPLD) 802, and a central processing unit (CPU) 804. The optical receiver-transmitter 800 includes a laser diode (LD), a photo detector (PD) or the like and is connected to other transmission apparatuses via the transmission lines 90 and 91. The optical receiver-transmitter 800 converts an optical signal, which is input from the transmission line 90, into an electrical signal which is then output to the FPGA 801, and converts a client signal, which is input from the FPGA 801, into an optical signal which is then transmitted to other transmission apparatuses via the transmission line 91.

In addition, the optical receiver-transmitter 802 includes an LD, a PD or the like and is connected to the switch 81 via transmission lines within the apparatus. The optical receiver-transmitter 802 converts a client signal, which is input from the switch 81, into an electrical signal which is then output to the FPGA 801, and converts a client signal, which is input from the FPGA 801, into an optical signal which is then output to the switch 81.

The FPGA 801 is a device whose internal circuits may be freely configured based on configuration data. The FPGA 801 includes SERDES circuits83 and 87, data conversion circuits 84 and 86, and a frame processing circuit 85. The CPLD 803 and the CPU 804 perform a variety of settings and controls for the SERDES circuits 83 and 87, the data conversion circuits 84 and 86, and the frame processing circuit 85.

The SERDES circuit 83 converts serial data of an input client signal S into parallel data DT which is then output to the data conversion circuit 84 along with a clock signal CLK. In this example, the client signal S is of a constant bit rate (CBR) of 100 Gbps, the number of parallel data DT is 640, and the frequency of the clock signal CLK is 174 MHz, which are provided in a non-limitative manner. In addition, transmission lanes (called an "optical channel transport lane (OTL) 4.10") are respectively connected between the SERDES circuit 83 and the data conversion circuit 84 and between the SERDES circuit 87 and the data conversion circuit 86.

The data conversion circuit 84 converts a client signal into a format of an OTU frame which is then output, as the parallel data DT, to the frame processing circuit 85. In addition, the clock signal CLK is sequentially transmitted through the SERDES circuits 83 and 87, the data conversion circuits 84 and 86, and the frame processing circuit 85. Therefore, a signal processing is performed in synchronization with the SERDES circuits 83 and 87, the data conversion circuits 84 and 86, and the frame processing circuit 85.

Figure 2:
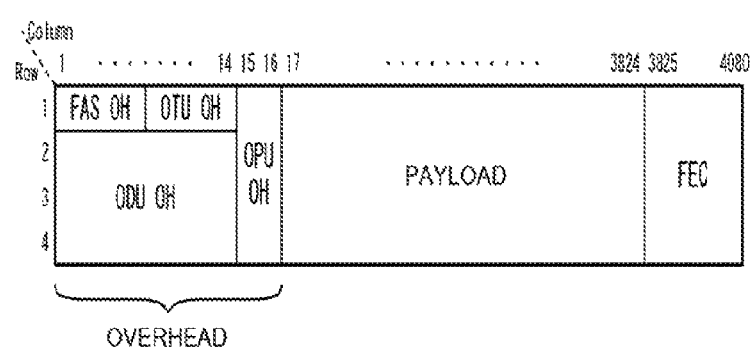
FIG. 2 is a view illustrating an exemplary configuration of an OTU frame.

FIG. 2 is a view illustrating an exemplary configuration of an OTU frame. The OTU frame has three areas in which an overhead, a payload, and a forward error correction (FEC) are respectively stored. In this example, the OTU frame defined in the ITU-T Recommendation G.709 is described as a format of a frame signal. However, the present disclosure is not limited thereto but may employ different formats of frames. In FIG. 2, "OH" denotes an overhead.

The overhead area includes a frame alignment signal (FAS) overhead, an OTU overhead, and an optical channel payload unit (OPU) overhead, each of which contains a variety of control information. In addition, the payload area has one or more tributary slots (TSs) (not illustrated) which are logic channels, and accommodates a client signal for each TS.

Correction codes of data errors of the overhead area and the payload area are accommodated in the FEC area. Positions of data within the OTU frame are specified by columns (see "Column") and rows (see "Row"). Data of one byte is contained in one column.

Referring back to FIG. 1, the frame processing circuit 85 performs a variety of processes for the OTU frame. After processing the OTU frame, the frame processing circuit 85 outputs the processed OTU frame, as the parallel data DT, to the data conversion circuit 86. The OTU frame is an example of a frame signal.

The data conversion circuit 86 converts the OTU frame into a client signal and outputs the client signal, as the parallel data DT, to the SERDES circuit 87. The SERDES circuit 87 converts the parallel data DT of the client signal S into serial data and outputs the serial data.

Figure 3:
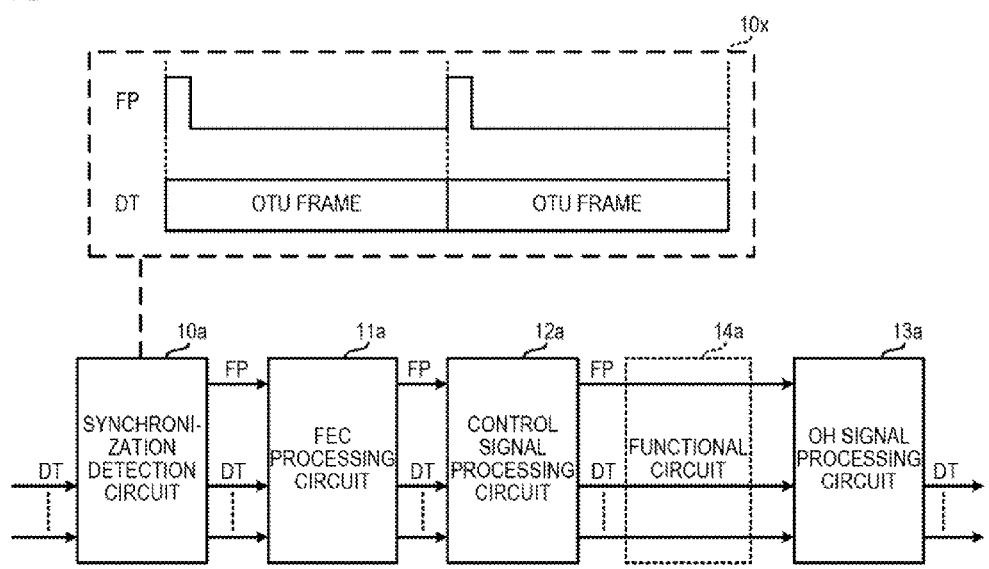
FIG. 3 is a view illustrating a configuration of a frame processing circuit in a comparative example.

FIG. 3 is a view illustrating a configuration of a frame processing circuit 85 in a comparative example. The frame processing circuit 85 includes a synchronization detection circuit 10*a*, an FEC processing circuit 11*a*, a control signal processing circuit 12*a*, and an OH signal processing circuit 13*a*.

As denoted by the reference numeral 10*x*, the synchronization detection circuit 10*a* generates a frame pulse FP by performing an OTU frame synchronization process. The frame pulse FP is an example of a pulse signal synchronized with the OTU frame and represents a head of the OTU frame. The frame pulse FP and the parallel data DT are sequentially transmitted to the FEC processing circuit 11*a*, the control signal processing circuit 12*a*, and the OH signal processing circuit 13*a*.

The FEC processing circuit 11*a* performs a process related to FEC of the OTU frame. The control signal processing circuit 12*a* performs a process related to a control signal such as an AIS signal of the OTU frame. The OH signal processing circuit 13*a* performs a process related to an overhead of the OTU frame.

An interface among the synchronization detection circuit 10*a*, the FEC processing circuit 11*a*, the control signal processing circuit 12*a*, and the OH signal processing circuit 13*a* is common since it is constituted from the frame pulse FP and the parallel data DT, and the above-mentioned processes are completed within the respective circuits 10*a* to 13*a*. Therefore, the frame processing circuit 85 facilitates an addition of a new functional circuit 14*a* (see the dotted line)

or a deletion of an unnecessary functional circuit 14a and also facilitates a change in design.

However, a circuit scale is increased since each of the FEC processing circuit 11a, the control signal processing circuit 12a, and the OH signal processing circuit 13a is configured with the following signal processing circuits.

Figure 4:
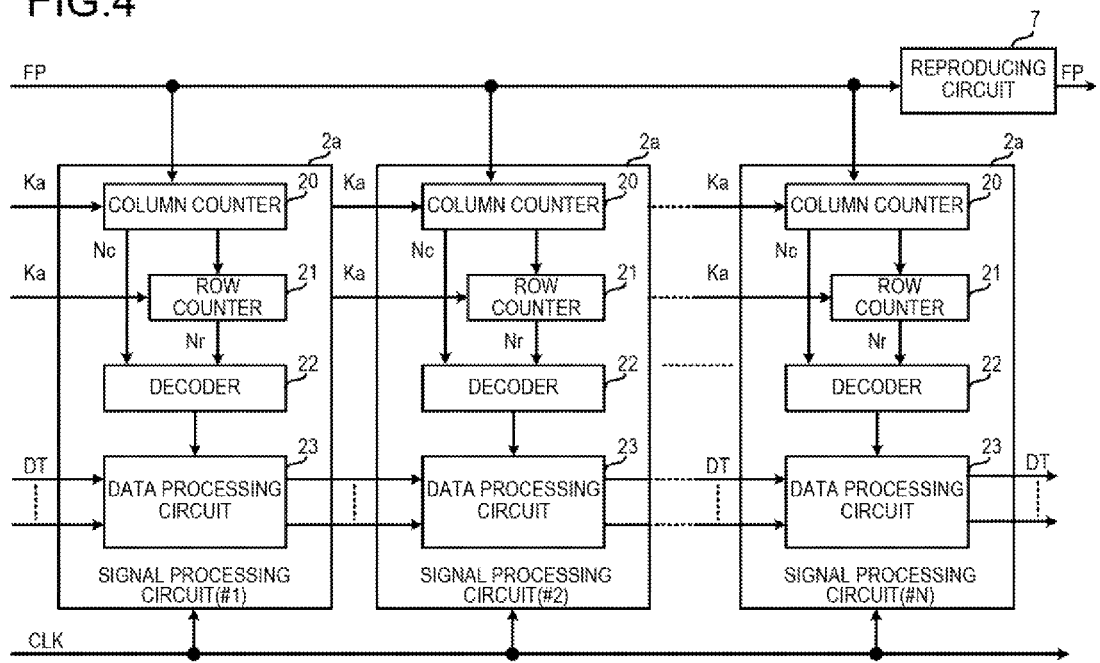
FIG. 4 is a view illustrating a configuration of a signal processing circuit in the comparative example.

FIG. 4 is a view illustrating a configuration of a signal processing circuit in the comparative example. Each of the FEC processing circuit 11a, the control signal processing circuit 12a, and the OH signal processing circuit 13a includes a plurality of signal processing circuits (#1, #2, . . . , #N (N is a positive integer)) 2a and a reproducing circuit 7. The plurality of signal processing circuits 2a is connected in series, and the frame pulse FP and the clock signal CLK are input to each of the plurality of signal processing circuits 2a.

Each signal processing circuit 2a includes a column counter 20, a row counter 21, a decoder 22, and a data processing circuit 23. The column counter 20 counts columns (see the "Column" in FIG. 2) of the OTU frame according to the clock signal CLK based on the frame pulse FP. The row counter 21 is set based on a count value Nc of the column counter 20 and counts rows (see the "Row" in FIG. 2) of the OTU frame according to the clock signal CLK.

The decoder 22 instructs the data processing circuit 23 to process the parallel data DT when each of the count value Nc of the column counter 20 and a count value Nr of the row counter 21 reaches a predetermined value. That is, the decoder 22 detects a timing at which the parallel data DT is to be processed, based on the count value Nc of the column counter 20 and the count value Nr of the row counter 21. After subjecting the parallel data DT to a predetermined process, the data processing circuit 23 outputs the processed parallel data DT to the signal processing circuit 2a at the subsequent stage.

In addition, delay information Ka indicating a delay time of the processing of the data processing circuit 23 is notified from the previous signal processing circuit 2a to the subsequent signal processing circuit 2a. The column counter 20 and the row counter 21 adjust initial values (i.e., values at the time of load) of their respective count values Nc and Nr according to the delay information Ka in order to correct the processing timing in the data processing circuit 23. The reproducing circuit 7 reproduces the frame pulse FP based on the delay time in all the signal processing circuits 2a.

Figure 5:
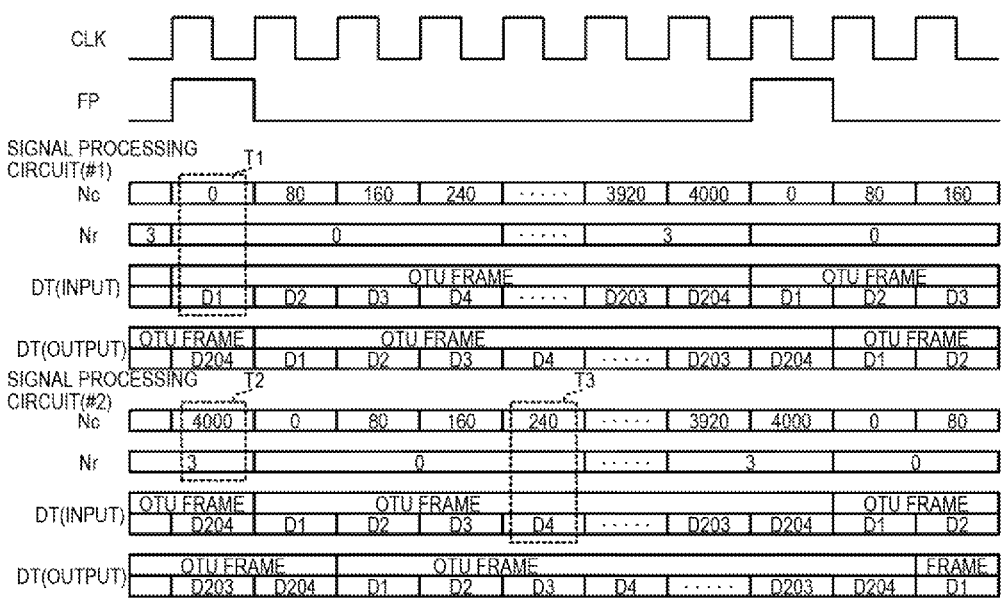
FIG. 5 is a timing chart of the signal processing circuit in the comparative example.

FIG. 5 is a timing chart of the signal processing circuits 2a in the comparative example, illustrating the frame pulse FP, the clock pulse CLK, the count values Nc and Nr of the column counter 20 and the row counter 21, and input/output OTU frame data D1 to D204 of the previous signal processing circuit (#1) 2a and the subsequent signal processing circuit (#2) 2a. The data D1 to D204 represent the parallel data DT by 80 bytes.

Each of the signal processing circuit (#1) 2a and the signal processing circuit (#2) 2a subjects the OTU frame to an individual signal processing at an individual timing. For example, the signal processing circuit (#1) 2a processes the data D1 at a position of row "0" of column "0," among the parallel data DT of the input OTU frame. Accordingly, the signal processing circuit (#1) 2a detects, through the decoder 22, a timing T1 at which the count value Nc of the column counter 20 becomes 0 and the count value Nr of the row counter 21 becomes 0, and processes the data D1 by means of the data processing circuit 23. The timing T1 coincides with a timing indicated by the frame pulse FP.

In addition, for example, the signal processing circuit (#2) 2a processes the data D1 at a position of row "0" of column "240," among the parallel data DT of the input OTU frame. However, the head data D1 of the parallel data DT output from the previous signal processing circuit (#1) 2a is delayed by one clock of the clock signal CLK from the frame pulse FP due to the delay time of the processing of the data processing circuit 23.

Accordingly, the signal processing circuit (#2) 2a receives from the previous signal processing circuit (#2) 2a a notification of the delay information Ka indicating the delay time of one clock, and adjusts the initial values of the count values Nc and Nr of the column counter 20 and the row counter 21 based on the delay information Ka. Accordingly, at a timing T2 indicated by the frame pulse FP, the column counter 20 is loaded to the count value Nc=4000, and the row counter 21 is loaded to the count value Nr=3. The signal processing circuit (#2) 2a detects, through the decoder 22, a timing T3 at which the count value Nc of the column counter 20 becomes 240 and the count value Nr of the row counter 21 becomes 0, and processes the data D4 by means of the data processing circuit 23.

In this way, since each signal processing circuit 2a includes the column counter 20, the row counter 21, and the decoder 22, in order to construct each signal processing circuit 2a, more parallel data DT require an FPGA 801 including more FFs and more LUTs. Further, the dense arrangement of the signal processing circuits 2a within the FPGA 801 requires FFs and LUTs for adjusting timings of the circuits. For example, the column counter 20, the row counter 21, the decoder 22, and the data processing circuit 23 are copied and arranged at positions different from a position of a source of copy. Therefore, the signal processing circuits 2a are increased in scale, requiring a large-capacity FPGA 801, which may result in the increase in apparatus costs.

Therefore, in an embodiment, a shift register circuit generates a plurality of timing pulses from the frame pulse FP synchronized with the OTU frame, and the plurality of signal processing circuits 2a processes the parallel data DT of the OTU frame at timings detected from the individual timing pulses, thereby reducing the circuit scale.

Figure 6:
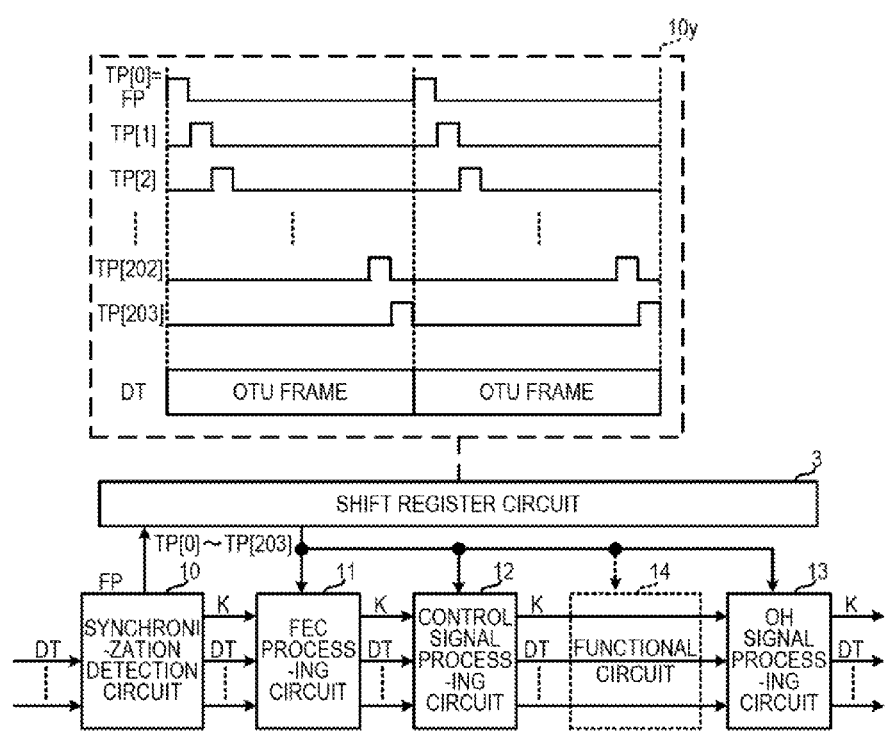
FIG. 6 is a view illustrating a configuration of a frame processing circuit in an embodiment.

FIG. 6 is a view illustrating a configuration of the frame processing circuit in an embodiment. The frame processing circuit 85 includes a shift register circuit 3, a synchronization detection circuit 10, an FEC processing circuit 11, a control signal processing circuit 12, and an OH signal processing circuit 13. In addition, the synchronization detection circuit 10, the FEC processing circuit 11, the control signal processing circuit 12, and the OH signal processing circuit 13 perform the same signal processings as those of the synchronization detection circuit 10a, the FEC processing circuit 11a, the control signal processing circuit 12a, and the OH signal processing circuit 13a of FIG. 3, respectively. The shift register circuit 3 is an example of a shift register.

The synchronization detection circuit 10 generates the frame pulse FP by performing the synchronization processing of the OTU frame and outputs the generated frame pulse FP to the shift register circuit 3. The shift register circuit 3 generates a plurality of timing pulses TP[0] to TP[203] indicating different timings from the frame pulse FP.

The reference numeral 10y denotes a timing chart of the timing pulses TP[0] to TP[203] generated in the shift register circuit 3. The timing pulses TP[0] to TP[203] are deviated from each other by one clock of the clock signal CLK. The timing pulse TP[0] coincides with the frame pulse FP and indicates the head of the OTU frame. The timing pulse TP[203] indicates the tail of the OTU frame. The width of each of the timing pulses TP[0] to TP[203] corresponds to the one clock width of the clock signal CLK. The number of timing pulses TP[0] to TP[203] is determined, e.g., based on the length (corresponding to 204 clocks) of the parallel data DT of an OTU4 frame.

The timing pulses TP[0] to TP[203] are input to the FEC processing circuit 11, the control signal processing circuit 12, and the OH signal processing circuit 13. The FEC processing circuit 11, the control signal processing circuit 12, and the OH signal processing circuit 13 detect timings of the processing of the parallel data DT according to the timing pulses TP[0] to TP[203].

A time-based positional relationship between the parallel data DT of the OTU frame and the timing pulses TP[0] to TP[203] is not constant due to a delay time of the processing of the parallel data DT. Therefore, delay information K indicating the delay time of each processing is sequentially transmitted among the synchronization detection circuit 10, the FEC processing circuit 11, the control signal processing circuit 12, and the OH signal processing circuit 13.

The FEC processing circuit 11, the control signal processing circuit 12, and the OH signal processing circuit 13 select the timing pulses TP[0] to TP[203] for timing detection based on the delay information K. Thus, the deviation of the timings of the signal processing among the FEC processing circuit 11, the control signal processing circuit 12, and the OH signal processing circuit 13 is corrected.

In addition, the interface among the synchronization detection circuit 10, the FEC processing circuit 11, the control signal processing circuit 12, and the OH signal processing circuit 13 is common since it is constituted from the delay information K and the parallel data DT, and the above-mentioned processes are completed within the respective sections 10 to 13. Therefore, the frame processing circuit 85 facilitates an addition of a new functional circuit 14 (see the dotted line) or a deletion of an unnecessary functional circuit 14, and also facilitates a change in design.

Figure 7:
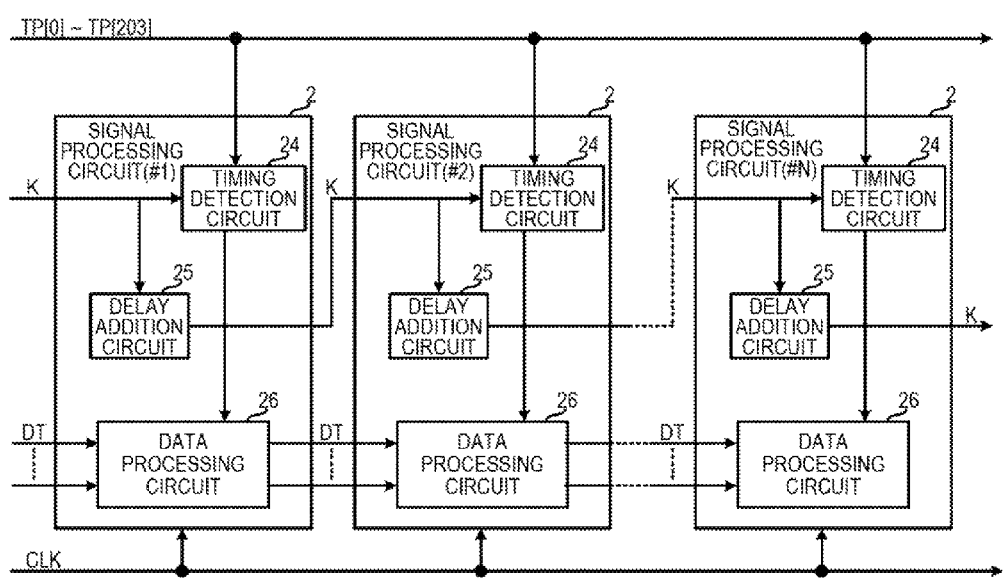
FIG. 7 is a view illustrating a configuration of a signal processing circuit in the embodiment.

FIG. 7 is a view illustrating a configuration of a signal processing circuit in the embodiment. Each of the FEC processing circuit 11, the control signal processing circuit 12, and the OH signal processing circuit 13 includes a plurality of signal processing circuits (#1, #2, ..., #N) 2. The plurality of signal processing circuits 2 is connected in series, and the timing pulses TP[0] to TP[203] and the clock signal CLK are input to each of the plurality of signal processing circuits 2. The plurality of signal processing circuits are examples of a plurality of signal processor.

The plurality of signal processing circuits (#1 to #N) 2 sequentially processes the OTU frame based on timings indicated by one or more of the timing pulses TP[0] to TP[203]. Therefore, unlike the signal processing circuits 2a in the comparative example, the plurality of signal processing circuits 2 are able to detect timings of the processing of the OTU frame without using the column counter 20 and the row counter 21 which need many FFs and LUTs. Therefore, the circuit scale of the FPGA 801 is reduced.

Each signal processing circuit 2 includes a timing detection circuit 24, a delay addition circuit 25, and a data processing circuit 26 and operates according to the clock signal CLK. The timing detection circuit 24 detects a timing of the processing of the parallel data DT from the timing pulses TP[0] to TP[203] and notifies the detected timing to the data processing circuit 26. The data processing circuit 26 processes the parallel data DT input from the previous signal processing circuit 2 and outputs the processed parallel data DT to the subsequent signal processing circuit 2.

In addition, the previous signal processing circuit 2 notifies the delay information K indicating the delay time of the processing of the data processing circuit 26 to the subsequent signal processing circuit 2. The subsequent signal processing circuit 2 selects one or more timing pulses from the timing pulses TP[0] to TP[203] according to the delay information K and processes the OTU frame based on timings indicated by the selected timing pulses.

For example, the timing detection circuit 24 of the signal processing circuit (#2) 2 receives a notification of the delay information K from the previous signal processing circuit (#1) 2. The delay information K indicates a delay time of the processing in the data processing circuit 26 of the previous signal processing circuit (#1) 2, for example, in the unit of a clock of the clock signal CLK.

The timing detection circuit 24 of the signal processing circuit (#2) 2 detects a timing based on the timing pulse TP[2] when the delay information K is 0, and detects a timing based on the timing pulse TP[3] (=TP[2+1]) when the delay information K is 1. Accordingly, the deviation between the timings of the signal processing in the respective signal processing circuits 2 is corrected.

Each signal processing circuit 2 adds a delay time of the processing of the OTU frame of the data processing circuit 26 to a delay time of the delay information K notified from the previous signal processing circuit 2, and notifies a result of the addition to the subsequent signal processing circuit 2. More specifically, the delay addition circuit 25 adds the delay time of the data processing circuit 26 to the delay time indicated by the delay information K input from the previous signal processing circuit 2 and outputs delay information K indicating a result of the addition to the subsequent signal processing circuit 2.

Therefore, the delay information K indicates an accumulated value of the delay times of each signal processing circuit 2, and each signal processing circuit 2 may correct the deviation between the timings of the signal processing in all previous signal processing circuits 2. In addition, the delay addition circuit 25 presets a delay time to be added.

Figure 8:
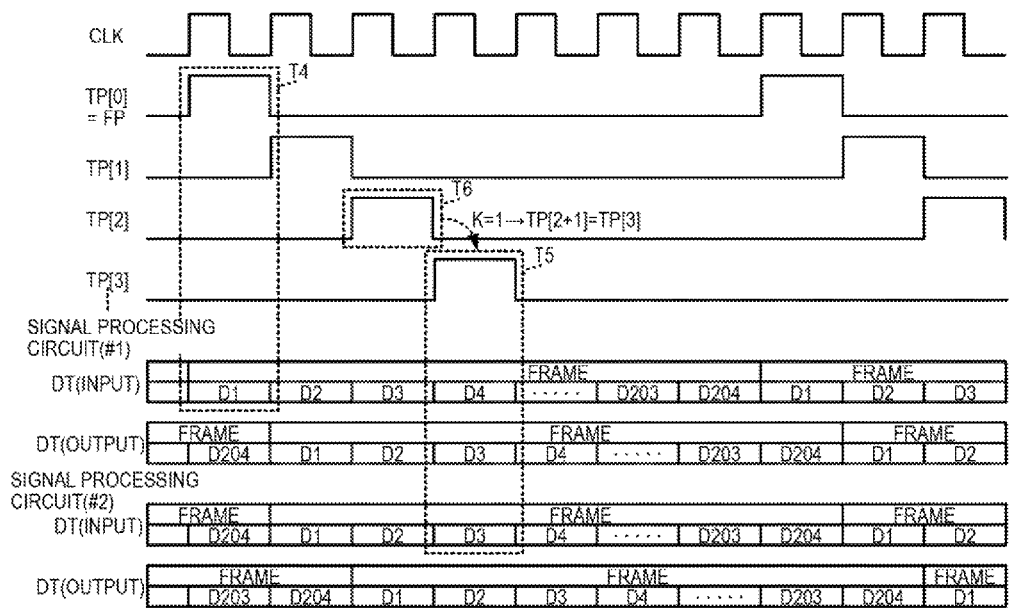
FIG. 8 is a timing chart of the signal processing circuit in the embodiment.

FIG. 8 is a timing chart of the signal processing circuits 2 in the embodiment. FIG. 8 illustrates the frame pulse FP, the clock pulse CLK, the timing pulses TP[0] to TP[3] (TP[4] and the followings are omitted), and the input/output OTU frame data D1 to D204 of the previous signal processing circuit (#1) 2 and the subsequent signal processing circuit (#2) 2.

Each of the signal processing circuit (#1) 2 and the signal processing circuit (#2) 2 subjects the OTU frame to an individual signal processing at an individual timing. For example, the signal processing circuit (#1) 2 processes the head data D1 among the parallel data DT of the input OTU frame. Accordingly, the signal processing circuit (#1) 2 detects, through the timing detection circuit 24, a timing T4 indicated by the timing pulse TP[0] (the frame pulse FP), and processes the data D1 by means of the data processing circuit 26.

In addition, for example, the signal processing circuit (#2) 2 processes the data D3 among the parallel data DT of the input OTU frame. However, the head data D1 of the parallel data DT output from the previous signal processing circuit (#1) 2 is delayed by one clock of the clock signal CLK from the frame pulse FP due to the delay time of the processing of the data processing circuit 26.

Accordingly, the timing detection circuit 24 of the signal processing circuit (#2) 2 receives, from the previous signal processing circuit (#2) 2, a notification of the delay information K (=1) indicating the delay time of one clock and selects the timing pulse TP[3] (=TP[2+1]) based on the delay information K. Accordingly, the timing detector 24 detects a timing T5 indicated by the timing pulse TP[3], rather than a timing T6 indicated by the timing pulse TP[2], and the data processing circuit 26 processes the data D3 at the timing T5. Thus, the deviation between the timings of the signal processing in the signal processing circuit (#2) 2 is corrected.

[Process of Generating AIS Signal of OTU4]

Next, as an example of the process of the signal processing circuits 2, a process of generating an AIS signal of OTU4 will be described. The AIS signal is to notify a downstream transmission apparatus of an occurrence of an alarm, and is generated by converting data of a predetermined area within the OTU4 frame into "1."

FIGS. 9 and 10 illustrate data areas P1 to P4 of a conversion object of an AIS signal of the OTU4 frame. C1 to C4, PD, ST, and FC denote types of data within the OTU frame illustrated in FIG. 2. C1 denotes data of a FAS overhead, C2 denotes data of an OTU overhead, C3 denotes data of an ODU overhead, and C4 denotes data of an OPU overhead.

In addition, PD denotes data of a payload area, and FC denotes data of a FEC area. ST denotes data of stuff bytes. "Column No." and "Row No." denote the "Column" and the "Row" in FIG. 2, respectively. "TP" denotes identification numbers 0 to 203 of the timing pulses TP[0] to TP[203] detecting the corresponding data. "Byte" and "Bit" denote positions of bytes and bits of the parallel data DT, respectively.

For example, the data C1 of the FAS overhead is located in row "0" of columns "1" to "7" of the OTU4 frame and accommodated in bytes "1" to "7" (bits "584" to "639") of the parallel data DT. When there is no delay time of the processing, the data C1 of the FAS overhead is detected at the timing of the timing pulse TP[0].

In addition, the data C3 of the ODU overhead is located in Row Nos. "2" to "4" of Column Nos. "1" to "14" of the OTU4 frame, respectively, and accommodated in bytes "1" to "14" (bits "528" to "639") of the parallel data DT. When there is no delay time of the processing, the data C3 of the ODU overhead is detected at the timings of the timing pulses TP[51], TP[102], and TP[153], respectively.

The data areas P1 to P4 surrounded by dotted frames are object areas to be converted into All "1" by each signal processing circuit 2. Since the data areas P1 to P4 to be converted are wider than data areas outside the conversion object, the signal processing circuit 2 of this example detects the data areas outside the conversion object by the timing pulses TP. When there is no detection, the signal processing circuit 2 determines that data at that time correspond to the data areas P1 to P4 to be converted, and converts the data areas P1 to P4 into All "1." However, the signal processing circuit 2 is not limited to the above-described method but may detect the data areas P1 to P4 of the conversion object by the timing pulses TPc and TPf and convert the data areas P1 to P4 into All "1."

Each signal processing circuit 2 divides bits "0" to "639" of the parallel data DT into four data groups A to D for conversion, according to the data areas P1 to P4 to be converted. Bits "536" to "639" of the parallel data DT are contained in the data group A, and bits "528" to "535" of the parallel data DT are contained in the data group B. Bits "128" to "527" of the parallel data DT are contained in the data group C, and bits "0" to "127" of the parallel data DT are contained in the data group D.

Figure 11:
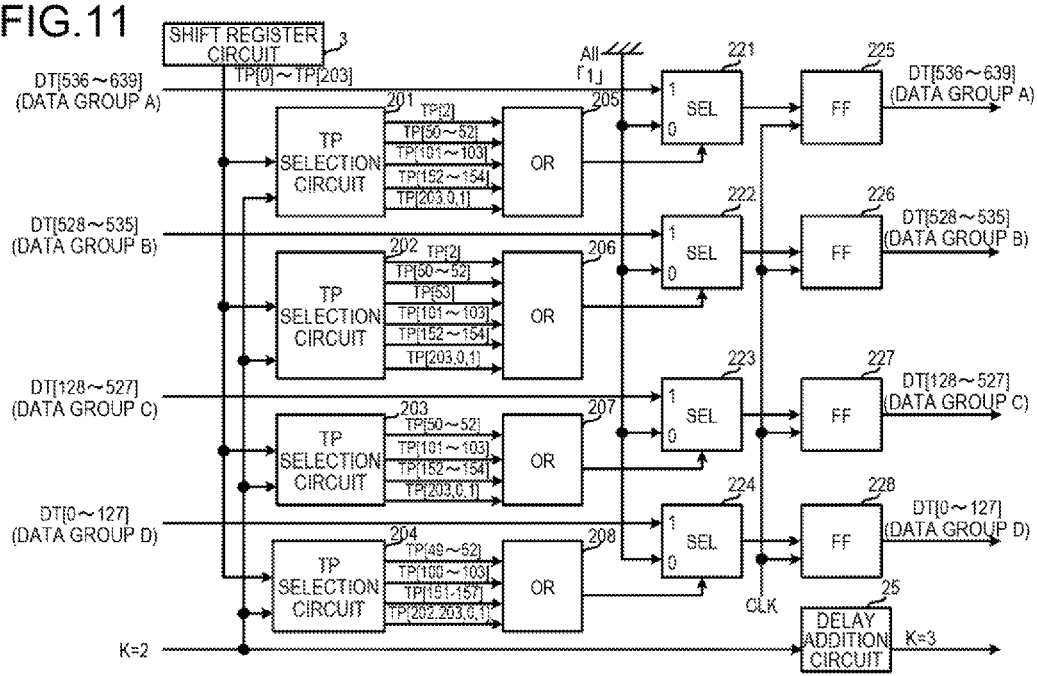
FIG. 11 is a circuit diagram illustrating an example of a signal processing circuit which performs a conversion process.

FIG. 11 is a circuit diagram illustrating an example of the signal processing circuit 2 which performs the conversion process. The signal processing circuit 2 includes TP selection circuits 201 to 204, OR circuits 205 to 208, selectors (SELs) 221 to 224, and FFs 225 to 228. The TP selection circuits 201 to 204 and the OR circuits 205 to 208 correspond to the timing detection circuit 24 in FIG. 7, and the selectors 221 to 224 and the FFs 225 to 228 correspond to the data processing circuit 26 in FIG. 7.

The TP selection circuit 201, the OR circuit 205, the selector 221, and the FF 225 perform the conversion process of the data group A, and the TP selection circuit 202, the OR circuit 206, the selector 222, and the FF 226 perform the conversion process of the data group B. The TP selection circuit 203, the OR circuit 207, the selector 223, and the FF 227 perform the conversion process of the data group C, and the TP selection circuit 204, the OR circuit 208, the selector 224, and the FF 228 perform the conversion process of the data group D.

The timing pulses TP[0] to [203] are input from the shifter register circuit 3 to the TP selection circuits 201 to 204, and the delay information K is input from the previous signal processing circuit 2 to the TP selection circuits 201 to 204. The TP selection circuits 201 to 204 select timing pulses TP[0] to [203] from the timing pulses TP[0] to [203] corresponding to data areas outside the conversion objects of the data groups A to D, based on the delay information K.

For example, the TP selection circuit 201 acquires the timing pulses TP[0], TP[48] to TP[50], TP[99] to TP[101], TP[150] to TP[152], and TP[201] to TP[203] (see FIGS. 9 and 10) corresponding to data areas outside the conversion object of the TP data group A from the timing pulses [0] to [203]. The TP selection circuit 201 selects the timing pulses TP[2], TP[50] to TP[52], TP[101] to TP[103], TP[152] to TP[154], TP[203], TP[0], and TP[1] from the acquired timing pulses TP based on the delay information K(=2).

For example, the TP selection circuit 201 changes the acquired timing pulse TP[0] to the timing pulse TP[2] (=TP[0+2]) and changes the acquired timing pulses TP[48] to TP[50] to the timing pulses TP[50] to TP[52] (=TP[48+2] to TP[50+2]), respectively. In addition, the TP selection circuit 201 changes the acquired timing pulses TP[201] to TP[203] to the timing pulses TP[203], TP[0], and TP[1] (=TP[201+2], TP[202→0] and TP[202→1]), respectively.

Thus, the deviation between the timings of the signal processing in the signal processing circuit 2 is corrected. The other TP selection circuits 202 to 204 also select the timing pulses TP for the data groups B to D in the same way as the TP selection circuit 201.

The timing pulses TP selected by the TP selection circuits 201 to 204 are input to the OR circuits 205 to 208. The OR circuits 205 to 208 operates the logical sum (OR) of the input timing pulses TP and outputs the operation value to the selectors 221 to 224.

That is, upon detecting a timing indicated by any of the input timing pulses TP, the OR circuits 205 to 208 output "1" to the selectors 221 to 224. Accordingly, when the operation value output from the OR circuits 205 to 208 is "1," data areas outside the conversion objects of the data groups A to D are detected. Conversely, when the operation value output from the OR circuits 205 to 208 is "0," the data areas P1 to P4 of the conversion objects of the data groups A to D are detected.

The parallel data DT of the data groups A to D, the data of All "1," and the operation value of the OR circuits 205 to 208 are input to the selectors 221 to 224. The selectors 221 to 224 select one of the parallel data DT and the data of All "1" depending on whether the operation value of the OR circuits 205 to 208 is "0" or "1," and output the selected one to the FFs 225 to 228.

When the operation value of the OR circuits 205 to 208 is "1," the selectors 221 to 224 select the parallel data DT and output it to the FFs 225 to 228. When the operation value of the OR circuits 205 to 208 is "0," the selectors 221 to 224 select the data of All "1" and output it to the FFs 225 to 228. Accordingly, when the operation value is "0," the data areas P1 to P4 of the conversion object are converted into All "1" which is to be output. When the operation value is "1," the data areas outside the conversion object are output without being converted.

The clock signal CLK and the parallel data DT from the selectors 221 to 224 are input to the FFs 225 to 228. The FFs 225 to 228 hold the input parallel data DT and output the parallel data DT to the subsequent signal processing circuit 2 according to an edge input of the clock signal CLK. Accordingly, as the parallel data DT is held in the FFs 225 to 228, the parallel data DT is delayed by one clock of the clock signal CLK from the timing pulses TP[0] to TP[203].

The delay addition circuit 25 adds a delay time in the FFs 225 to 228 to the delay time of the delay information K. Accordingly, the delay addition circuit 25 adds one clock to the delay information K (=2) and outputs a result of the addition, as the delay information K (=3), to the subsequent processing circuit 2. Accordingly, each signal processing circuit 2 may select the timing pulses TP based on an accumulated value of the delay times.

Figure 12:
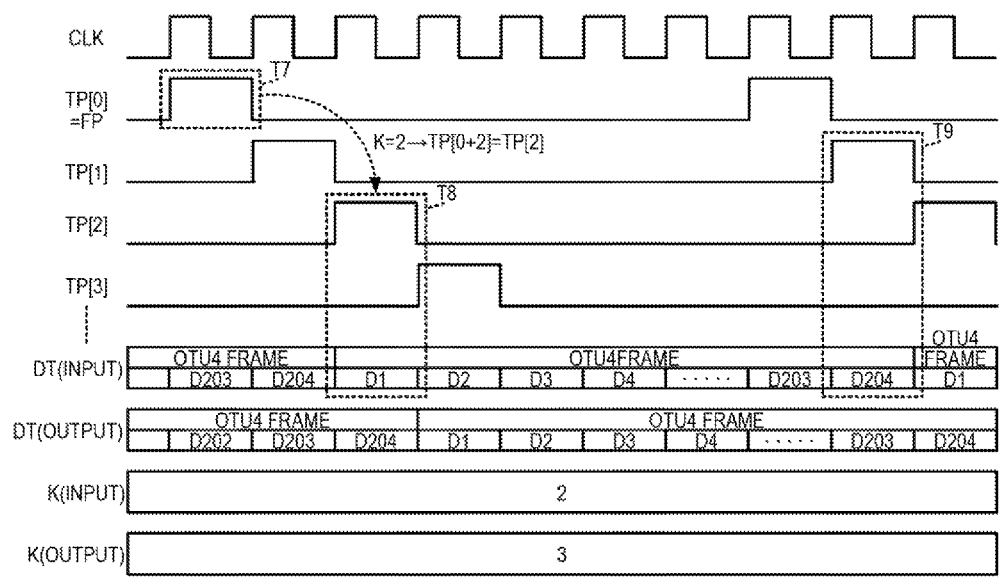
FIG. 12 is an exemplary timing chart of the signal processing circuit which performs the conversion process.

FIG. 12 is an example of a timing chart of the signal processing circuit 2 which performs the conversion process. FIG. 12 illustrates the clock signal CLK, the timing pulses TP[0] to TP[3] (TP[4] and the followings are omitted), the data D1 to D204 of the OTU frame input/output to the signal processing circuit 2 of FIG. 11, and the delay information K.

The head data D1 input to the signal processing circuit 2 is delayed by two clocks from a timing T7 indicated by the timing pulse TP[0] (the frame pulse FP). Accordingly, based on the delay information K=2, the signal processing circuit 2 detects the head data D1 at a timing T8 indicated by the timing pulse TP[2] later by two clocks than the timing pulse TP[0]. In addition, based on the delay information K=2, the signal processing circuit 2 detects the tail data D204 at a timing T9 indicated by the timing pulse TP[1] later by two clocks than the timing pulse TP[203].

[Process of Generating AIS Signal of OTU1]

Next, as an example of the process of the signal processing circuits 2, a process of generating an AIS signal of OTU1 will be described. The AIS signal is generated by converting data of a predetermined area within the OTU1 frame into "1."

The width of the parallel data DT of the OTU1 frame is 16 [bit] which is smaller than that of the OTU4 frame. The length of the parallel data DT of the OTU1 frame corresponds to 8160 clocks which is larger than that of the OTU4 frame. Accordingly, as in the OTU1 frame, when a timing is detected only by the shift register circuit 3, it is necessary to provide a number of FFs to constitute the shift register circuit 3.

Therefore, in this example, the circuit scale of the FPGA 801 is suppressed by using a shift register circuit and a counter in combination. More specifically, a column counter circuit, a row counter circuit, a shift register circuit for generating a timing pulse for a processing of an overhead area, and a shift register circuit for generating a timing pulse for a processing of an FEC area are used in common for the signal processing circuits. This circuit configuration will be described later with reference to FIG. 15.

FIGS. 13 and 14 illustrate data areas P11 to P14 of a conversion object of an AIS signal of the OTU1 frame. In FIGS. 13 and 14, the same items as those in FIGS. 9 and 10 will be denoted by the same terms as used in FIGS. 9 and 10, and explanation thereof will be omitted.

"OH" denotes data of an overhead area within the OTU frame illustrated in FIG. 2. "Column Counter Value" and The "Row Counter Value" denote a count value of a column counter and a count value of a row counter, respectively. "TPc" denotes identification numbers 0 to Lc of timing pulses TPc[0] to TPc[Lc] indicating timings of the data processing of the overhead area. "TPf" denotes identification numbers 0 to Lf of timing pulses TPf[0] to TPf[Lf] indicating timings of the data processing of the FEC area. Here, Lc and Lf are determined by the delay information K.

The timing pulses TPc[0] to TPc[Lc] begin to operate when the column counter value marks 2039, and indicate timings of the processing of the data OH of the overhead area. The timing pulses TPf[0] to TPf[Lf] begin to operate when the column counter value marks 1911, and indicate timings of the processing of the data FC of the FEC area. The signal processing circuit 2 detects timings of the processing of the parallel data DT from the row counter value, the timing pulses TPc[0] to TPc[Lc], and the timing pulses TPf[0] to TPf[Lf].

The signal processing circuit 2 divides bits "0" to "15" of the parallel data DT into two data groups A and B for conversion, according to the data areas P11 to P14 to be converted. Bits "8" to "15" of the parallel data DT are contained in the data group A, and bits "0" to "7" of the parallel data DT are contained in the data group B.

In addition, since the data areas P11 to P14 to be converted are wider than data areas outside the conversion object, the signal processing circuit 2 of this example detects the data area outside the conversion object by the timing pulses TPc and TPf. When there is no detection, the signal processing circuit 2 determines that data at that time correspond to the data areas P11 to P14 to be converted, and converts the data areas P11 to P14 into All "1." However, the signal processing circuit 2 is not limited to the above-described method but may detect the data areas P11 to P14 of the conversion object by the timing pulses TPc and TPf and convert the data areas P11 to P14 into All "1."

Figure 15:
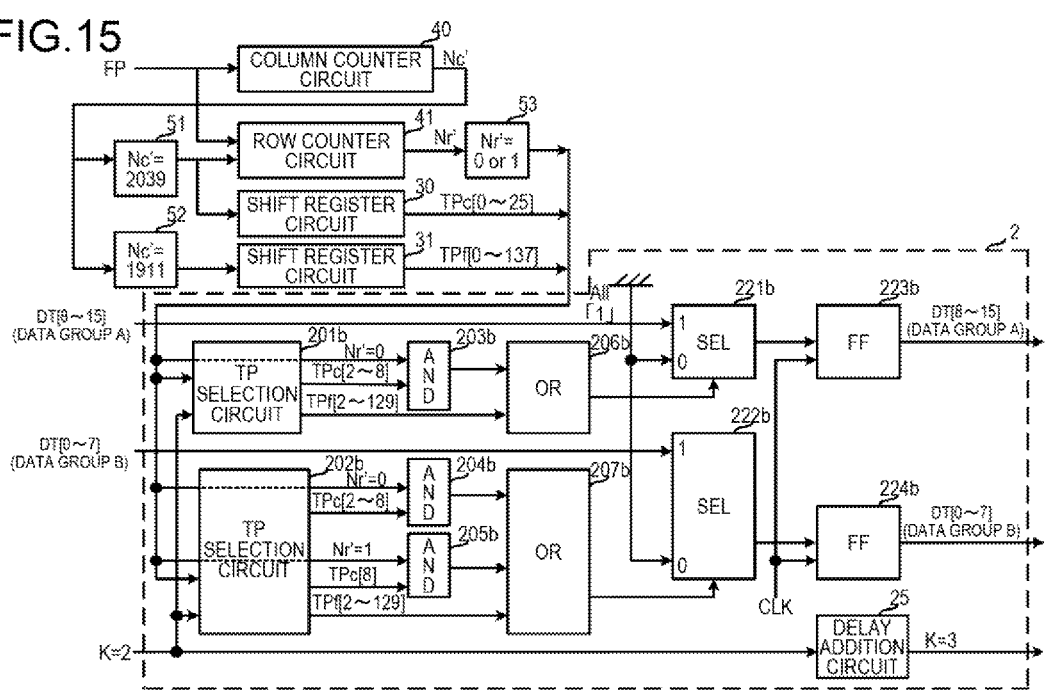
FIG. 15 is a circuit diagram illustrating another example of the signal processing circuit which performs the conversion process.

FIG. 15 is a circuit diagram illustrating another example of the signal processing circuit 2 which performs the conversion process. FIG. 15 illustrates a column counter circuit 40, a row counter circuit 41, shift register circuits 30 and 31, and decoders 51 to 53, all of which are connected to the signal processing circuit 2.

The column counter circuit 40 and the row counter circuit 41 are an example of a counter circuit and count columns and rows of the OTU1 frame according to an input of the frame pulse FP. A count value Nc' of the column counter circuit 40 is input to the decoders 51 and 52, and a count value Nr' of the row counter circuit 41 is input to the decoder 53.

The row counter circuit 41 and the decoder 53 are an example of a detection circuit and detect data of rows "0" and "1" in the OTU1 frame based on the frame pulse FP. More specifically, when Nr' is 0, the decoder 53 outputs a detection pulse, which indicates that Nr' is 0, to the signal processing circuit 2. When Nr' is 1, the decoder 53 outputs a detection pulse, which indicates that Nr' is 1, to the signal processing circuit 2.

Thus, since the decoder 53 detects the parallel data DT of rows "0" and "1" based on the count value Nr' of the row counter circuit 41, it is possible to provide a circuit configuration simpler than a case of detecting data with a circuit for comparing data patterns.

In addition, the decoder 51 detects the count value Nc' (=2039) of the column counter circuit 40 and outputs the detection pulse to the row counter circuit 41 and the shift register circuit 30. That is, the decoder 53 detects the parallel data DT at the tail of each row of the OTU1 frame and notifies the detected parallel data DT to the row counter circuit 41 and the shift register circuit 30.

The row counter circuit 41 is loaded according to an input of the detection pulse from the decoder 51 or an input of the frame pulse FP and sets the count value Nr' to an initial value. Accordingly, the row counter circuit 41 may add one count value Nr' after the tail parallel data DT in each column.

The shift register circuit 30 generates a plurality of timing pulses TPc[0] to TPc[25] indicating timings of the parallel data DT of the overhead area according to an input of the detection pulse from the decoder 51 and outputs the generated timing pulses TPc[0] to TPc[25] to the signal processing circuit 2.

The decoder 52 detects the count value Nc' (=1911) of the column counter circuit 40 and outputs the detection pulse to the shift register circuit 31. That is, the decoder 52 detects the tail parallel data DT of the data PD of the payload area of the OTU1 frame and notifies the detected parallel data DT to the shift register circuit 31.

The shift register circuit 31 generates a plurality of timing pulses TPc[0] to TPc[137] indicating timings of the parallel data DT of the FEC area according to an input of the detection pulse from the decoder 52 and outputs the generated timing pulses TPc[0] to TPc[137] to the signal processing circuit 2.

The signal processing circuit 2 includes TP selection circuits 201b and 202b, AND circuits 203b to 205b, OR circuits 206b and 207b, selectors 221b and 222b, FFs 223b and 224b, and a delay addition circuit 25. The delay addition circuit 25 has been described with reference to FIG. 11, and therefore, explanation thereof will be repeated.

The TP selection circuit 201b, the AND circuit 203b, the OR circuit 206b, the selector 221b, and the FF 223b perform the conversion process of the data group A. In addition, the TP selection circuit 202b, the AND circuits 204b and 205b, the OR circuit 207b, the selector 222b, and the FF 224b perform the conversion process of the data group B.

The timing pulses TPc[0] to TPc[25] and TPf[0] to TPf[137] are input from the shift register circuits 30 and 31 to the TP selection circuits 201b and 202b, and the detection pulse (Nr'=0 or 1) is input from the decoder 53 to the TP selection circuits 201b and 202b. In addition, the delay information K is input from the previous signal processing circuit 2 to the TP selection circuits 201b and 202b. The TP selection circuits 201b and 202b select timing pulses TPc and TPf from the timing pulses TPc[0] to TPc[25] and TPf[0] to TPf[137] corresponding to data areas outside the conversion objects of the data groups A and B, based on the delay information K.

For example, the TP selection circuit 201b acquires the timing pulses TPc[0] to TPc[6] and TPf[0] to TPf[127] (see FIGS. 13 and 14) corresponding to data areas outside the conversion object of the data group A from the timing pulses TPc[0] to TPc[25] and TPf[0] to TPf[137]. The TP selection circuit 201 selects the timing pulses TPc[2] to TPc[8] and TPf[2] to TPf[129] from the acquired timing pulses TPc and TPf based on the delay information K (=2).

Thus, the deviation between the timings of the signal processing in the signal processing circuit 2 is corrected. The TP selection circuit 202b also selects the timing pulses TPc[2] to TPc[8] and TPf[2] to TPf[129] based on the delay information K (=2) in the same way as the TP selection circuit 201b.

The timing pulses TPc and TPf are input from the TP selection circuits 201b and 202b to the AND circuits 203b to 205b, and the detection pulse (Nr'=0 or 1) is input from the decoder 53 to the AND circuits 203b to 205b. The AND circuits 203b to 205b operate the logical product (AND) of the input timing pulses TPc and TPf and the detection pulse, and outputs its operation value to the OR circuits 206b and 207b.

The AND circuits 203b to 205b detect the parallel data DT of row "1" corresponding to Nr' (=0) and row "2" corresponding to Nr' (=1), among rows "1" to "4" of the OTU1 frame, at timings indicated by the input timing pulses TPc and TPf. For example, the AND circuit 203b detects the data OH of the overhead area located in columns "1" to "14" of row "1" at timings of the timing pulses TPc[2] to TPc[8]. In addition, the AND circuit 205b detects the data OH of the overhead area located in columns "13" and "14" of row "2" at a timing of the timing pulse TPc[8].

The operation value is input from the AND circuits 203b to 205b to the OR circuits 206b and 207b, and the timing pulses TPf[2] to TPf[129] are input from the TP selection circuits 201b and 202b to the OR circuits 206b and 207b. The OR circuits 206b and 207b operate the logical sum (OR) of the input timing pulses TPf and the operation value of the AND circuits 203b to 205b and outputs its operation value to the selectors 221b and 222b.

That is, upon detecting a timing indicated by any of the input timing pulses TPf and the AND circuits 203b and 205b, the OR circuits 206b and 207b output "1" to the selectors 221b and 222b. Accordingly, when the operation value output from the OR circuits 206b and 207b is "1," data areas outside the conversion objects of the data groups A to D are detected. Conversely, when the operation value output from the OR circuits 206b and 207b is "0," the data areas P11 to P14 of the conversion objects of the data groups A and B are detected.

The parallel data DT of the data groups A and B, the data of All "1," and the operation value of the OR circuits 206b and 207b are input to the selectors 221b and 222b. The selectors 221b and 222b select one of the parallel data DT and the data of All "1" depending on whether the operation value of the OR circuits 206b and 207b is "0" or "1," and output the selected one to the FFs 223b and 224b.

When the operation value of the OR circuits 206b and 207b is "1," the selectors 221b and 222b select the parallel data DT and output it to the FFs 223b and 224b. When the operation value of the OR circuits 206b and 207b is "0," the selectors 221b and 222b select the data of All "1" and output the data to the FFs 223b and 224b. Accordingly, when the operation value is "0," the data areas P11 to P14 of the conversion object are converted into All "1" which is to be output. When the operation value is "1," the data areas outside the conversion object are output without being converted.

The clock signal CLK and the parallel data DT from the selectors 221b and 222b are input to the FFs 223b and 224b. The FFs 223b and 224b hold the input parallel data DT and output the parallel data DT to the subsequent signal processing circuit 2 according to an edge input of the clock signal CLK. Accordingly, as the parallel data DT is held in the FFs 223b and 224b, the parallel data DT is delayed by one clock of the clock signal CLK from the timing pulses TPc and TPf.

In this way, when the parallel data DT of rows "0" and "1" of the OTU1 frame is detected by the row counter circuit 41 and the decoder 53, the signal processing circuit 2 processes the parallel data DT based on the timings indicated by the timing pulses PTc[2] to PTc[8]. Accordingly, it is possible to further reduce the scale of the signal processing circuit 2 as compared to a case of using only shift register circuits.

Figure 16:
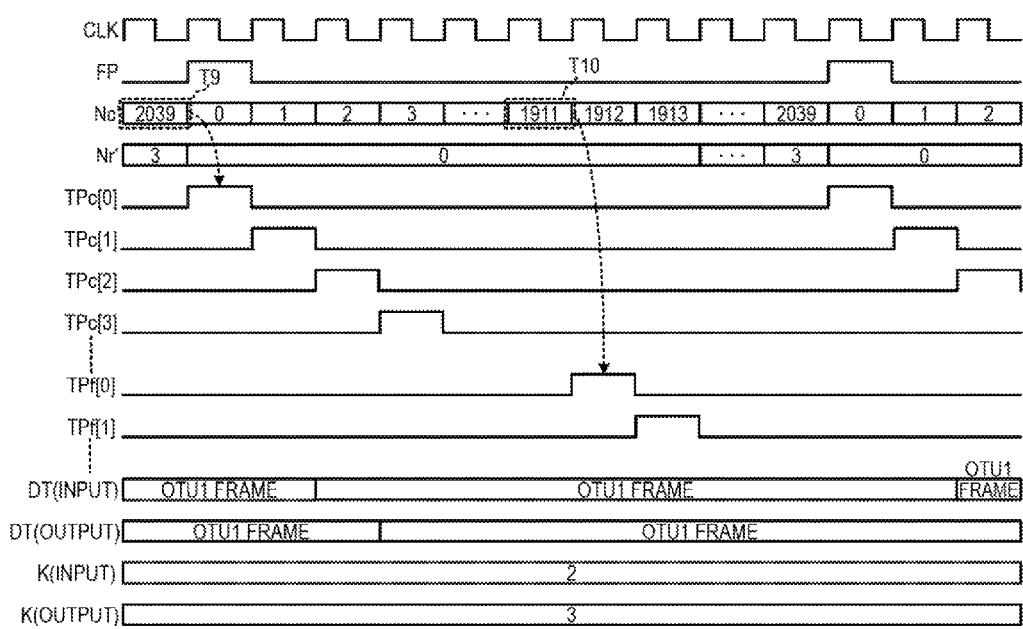
FIG. 16 is another exemplary timing chart of the signal processing circuit which performs the conversion process.

FIG. 16 is another example of the timing chart of the signal processing circuit 2 which performs the conversion process. FIG. 16 illustrates the clock signal CLK, the frame pulse FP, the timing pulses TPc[0] to TPc[3] (TPc[4] and the followings are omitted), the timing pulses TPf[0] and TPf[2] (TPf[3] and the followings are omitted), the data D1 to D204 of the OTU frame input/output to the signal processing circuit 2 of FIG. 11, and the delay information K.

The shift register circuit 30 sets TPc[0] to 1 by the decoder 51 at a timing T9 at which the count value Nc' of the column counter circuit 40 is 2039. Accordingly, the timing pulses TPc[0] to TPc[25] are sequentially output.

In addition, the shift register circuit 31 sets TPf[0] to 1 by the decoder 52 at a timing T10 at which the count value Nc' of the column counter circuit 40 is 1911, and begins its operation. Accordingly, the timing pulses TPf[0] to TPf[137] are sequentially output.

In this way, since the signal processing circuit 2 of this example is provided with the row counter circuit 41 and the column counter circuit 40, it is possible to reduce the number of the FFs of the shift register circuits 30 and 31. In addition, the row counter circuit 41 and the column counter circuit 40 are not provided for each signal processing circuit 2 but are shared by a plurality of signal processing circuits 2, thus having little effect on the circuit scale.

As described so far, the signal processing circuit 2 according to an embodiment includes the shift register circuits 3, 30, and 31 and the plurality of signal processing circuits 2. The shift register circuits 3, 30, and 31 generate a plurality of timing pulses TP, TPc, and TPf indicating different timings from the frame pulse FP synchronized with the OTU frame. The plurality of signal processing circuits 2 sequentially processes the OTU frame based on timings indicated by one or more timing pulses.

With the above-described configuration, the plurality of signal processing circuits 2 may detect timings of the processing of the OTU frame without using the column counter 20 and the row counter 21 which consume many FFs and LUTs, unlike the signal processing circuit 2a in the comparative example. Accordingly, it is possible to reduce the circuit scale of the FPGA 801.

The above-described embodiments are not intended to have a limited sense but may be modified and practiced in various ways without departing from the spirit and scope of the invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission apparatus comprising:
   a shift register configured to generate a plurality of timing pulses having a same frequency and indicating different timings, from a frame pulse synchronized with a frame signal; and
   a plurality of signal processors configured to sequentially process the frame signal based on timings indicated by one or more timing pulses among the plurality of timing pulses.

2. The transmission apparatus according to claim 1,
   wherein the plurality of signal processors are coupled with each other in series, and a first signal processor of the plurality of signal processors notifies a second signal processor of the plurality of signal processors subsequently coupled with the first signal processor of a first delay time for processing the frame signal in the first signal processor, and
   wherein the second signal processor selects the one or more timing pulses from the plurality of timing pulses according to the first delay time and processes the frame signal based on the timings indicated by the one or more timing pulses.

3. The transmission apparatus according to claim 2, wherein the second signal processor adds a second delay time for processing the frame signal in the second processing circuit to the first delay time and notifies a third signal processor of the plurality of signal processors subsequently coupled with the second signal processor of a result of the addition.

4. The transmission apparatus according to claim 1, further comprising:
   a detector configured to detect predetermined data contained in the frame signal based on the frame pulse,
   wherein, when the predetermined data is detected by the detector, each of the plurality of signal processors processes the frame signal based on the timings indicated by the one or more timing pulses.

5. The transmission apparatus according to claim 4, wherein the detector includes a counter for counting data within the frame signal according to an input of the frame pulse, and detects the predetermined data based on a count value of the counter.

* * * * *